(12) United States Patent
Sugihara

(10) Patent No.: US 11,662,153 B2
(45) Date of Patent: May 30, 2023

(54) PROTECTIVE STRUCTURE

(71) Applicant: NEC Platforms, Ltd., Kawasaki (JP)

(72) Inventor: Yuichi Sugihara, Tokyo (JP)

(73) Assignee: NEC Platforms, Ltd., Kanagawa (JP)

( * ) Notice: Subject to any disclaimer, the term of this patent is extended or adjusted under 35 U.S.C. 154(b) by 175 days.

(21) Appl. No.: 16/962,076

(22) PCT Filed: Feb. 12, 2019

(86) PCT No.: PCT/JP2019/004816
§ 371 (c)(1),
(2) Date: Jul. 14, 2020

(87) PCT Pub. No.: WO2019/159879
PCT Pub. Date: Aug. 22, 2019

(65) Prior Publication Data
US 2020/0340753 A1 Oct. 29, 2020

(30) Foreign Application Priority Data
Feb. 15, 2018 (JP) .............................. JP2018-025041

(51) Int. Cl.
*F28D 15/02* (2006.01)
*H01L 23/473* (2006.01)
(Continued)

(52) U.S. Cl.
CPC .......... *F28D 15/0233* (2013.01); *B23K 20/02* (2013.01); *H01L 23/473* (2013.01); *H01L 21/4882* (2013.01)

(58) Field of Classification Search
CPC ............... H01L 23/427; F28F 2265/12; F16K 17/1626; F16K 17/1613; F17C 2260/021; F17C 2203/069
See application file for complete search history.

(56) References Cited

U.S. PATENT DOCUMENTS 3,685,686 A * 8/1972 Raidl .................. F16K 17/1613
220/89.3
4,100,930 A * 7/1978 Orcutt ................. F16K 17/1613
137/79
(Continued)

FOREIGN PATENT DOCUMENTS

JP      S52-113467 U    2/1976
JP      S52-113467 A    9/1977
(Continued)

OTHER PUBLICATIONS

International Search Report for PCT Application No. PCT/JP2019/004816, dated May 7, 2019.
(Continued)

*Primary Examiner* — Jianying C Atkisson
*Assistant Examiner* — For K Ling
(74) *Attorney, Agent, or Firm* — Sughrue Mion, PLLC

(57) ABSTRACT

In order to reduce the adverse effect from a thermal medium splashing as a result of a vapor chamber bursting, this protective structure is provided with a perforation member comprising an end section that: comprises an upper surface and a lower surface; either comes into contact with a first surface, which is either the upper surface or the lower surface, or is located near the first surface, before a flat vapor chamber in contact with an electronic component is overheated by heat from the electronic component; and breaks an outer member of the vapor chamber and penetrates into the interior when the vapor chamber is overheated by the heat.

16 Claims, 13 Drawing Sheets

(51) Int. Cl.
  *B23K 20/02* (2006.01)
  *H01L 21/48* (2006.01)

(56) References Cited

U.S. PATENT DOCUMENTS

| | | | | |
|---|---|---|---|---|
| 4,706,740 | A | * | 11/1987 | Mahefkey ............ B64G 1/506 165/41 |
| 6,169,660 | B1 | * | 1/2001 | Sarraf .................. H01L 23/467 174/16.3 |
| 6,209,626 | B1 | * | 4/2001 | Bhatia .................. H01L 23/427 165/104.34 |
| 6,820,683 | B1 | * | 11/2004 | Hao .................... F28D 15/0266 165/104.29 |
| 7,748,398 | B2 | * | 7/2010 | Miller .................. B65D 77/06 220/89.3 |
| 2011/0005724 | A1 | | 1/2011 | Kasai et al. |
| 2016/0290739 | A1 | | 10/2016 | Mochizuki et al. |
| 2017/0293329 | A1 | * | 10/2017 | Chiriac .................... G06F 1/20 |

FOREIGN PATENT DOCUMENTS

| | | | |
|---|---|---|---|
| JP | S53-80047 | A | 7/1978 |
| JP | S62-245086 | A | 10/1987 |
| JP | 62272092 | A * | 11/1987 |
| JP | S62-272092 | A | 11/1987 |
| JP | 3007236 | U | 2/1995 |
| JP | 2001-339026 | A | 12/2001 |
| JP | 2008-185322 | A | 8/2008 |
| JP | 2010-151352 | A | 7/2010 |
| JP | 3171613 | U | 11/2011 |
| JP | 2012-132582 | A | 7/2012 |
| JP | 2014-056690 | A | 3/2014 |
| JP | 3203218 | U | 3/2016 |
| JP | 2016-188734 | A | 11/2016 |

OTHER PUBLICATIONS

English translation of Written opinion for PCT Application No. PCT/JP2019/004816, dated May 7, 2019.
Total Thermal Sollution, Heat Diffusion and Cooling Products, Furukawa Electric Group, Japan [Search on Jan. 23, 2018], Internet (http://www.furukawa.co.jp/product/catalogue/pdf/thermal.pdf).
Japanese Office Action for JP Application No. 2018-025041 dated Dec. 4, 2018 with English Translation.
Japanese Office Action for JP Application No. 2018-025041 dated Feb. 26, 2019 with English Translation.

* cited by examiner

PROTECTIVE STRUCTURE

This application is a National Stage Entry of PCT/JP2019/004816 filed on Feb. 12, 2019, which claims priority from Japanese Patent Application 2018-025041 filed on Feb. 15, 2018, the contents of all of which are incorporated herein by reference, in their entirety.

TECHNICAL FIELD

The present invention relates to a structure that reduces an adverse effect of an abnormality when the abnormality occurs.

BACKGROUND ART

A cooling mechanism called a vapor chamber is generally used in order to radiate heat of an electronic component that generates heat in an electronic apparatus and the like. The vapor chamber includes a liquid encapsulated therein, and radiates heat of the electronic component to an outside of the vapor chamber by local vaporization and liquefaction of the liquid. The vapor chamber is disclosed in NPL 1, for example.

Further, PTL 1 discloses a waste heat recovery device constituted of a combination of a sealing member that includes, at an end portion, a thin portion moving by an internal pressure inside a heat pipe, and a burst auxiliary member including a pointed end portion that faces an outer surface of the thin portion and is fixed to an end portion of the heat pipe.

CITATION LIST

Patent Literature

[PTL 1] Japanese Unexamined Patent Application Publication No. S62-272092

Non Patent Literature

[NPL 1] Total Thermal Sollution, Heat Diffusion and Cooling Products, Furukawa Electric Group, [Retrieved on Jan. 23, 2018], Internet (http://www.furukawa.co.jp/product/catalogue/pdf/thermal.pdf)

SUMMARY OF INVENTION

Technical Problem

The vapor chamber may burst due to overheating.

FIG. 1 is an image diagram illustrating a situation of a burst of a vapor chamber due to overheating.

A vapor chamber 111 is a vapor chamber for cooling an electronic component 106 that generates heat.

FIG. 1(a) illustrates the vapor chamber 111 before overheating due to heat generation by the electronic component 106.

An outer member 121 of the vapor chamber 111 is made of metal such as copper and aluminum. A thickness of the outer member 121 is, for example, equal to or less than 1 mm, and more typically, approximately 0.4 to 0.7 mm. Then, a not-illustrated thermal medium in a liquid form is encapsulated in a hollow portion of the vapor chamber sealed by the outer member 121. The thermal medium is, for example, water. A columnar member for holding a shape of the vapor chamber 111 may be provided between an upper portion and a lower portion of the outer member.

The vapor chamber 111 is installed on the electronic component 106 installed on a base substrate 101. The electronic component 106 is an electronic component that may generate heat, such as a central processing unit, for example. The vapor chamber 111 has a flat shape as illustrated in FIG. 1(a). A part of a lower surface of the vapor chamber 111 is in contact with an upper surface of the electronic component 106.

The vapor chamber 111 receives heat transmitted from the electronic component 106, and transmits the heat to surroundings.

FIG. 1(b) illustrates the vapor chamber 111 in an overheated state due to application of heat by the electronic component 106. In this state, the outer member 121 becomes deformed, and changes into a shape rounder than the shape of the vapor chamber 111 illustrated in FIG. 1(a).

FIG. 1(c) illustrates a state where the application of heat to the vapor chamber 111 further progresses from the state illustrated in FIG. 1(b). In the state illustrated in FIG. 1(c), a part of the outer member 121 bursts due to an expansion of the vaporized thermal medium, and a rupture portion 116 is generated. In this state, most of the thermal medium splashes to surroundings.

The thermal medium splashing to surroundings splashes after the vapor chamber 111 is overheated to a limit to which the vapor chamber 111 is bearable. Thus, a degree of splashing of the thermal medium is intense. Thus, the splashing may not only contaminate the electronic component 106, another surrounding component, and the like, but may also induce destruction of the electronic component 106, the another surrounding component, and the like.

Note that, as described in the section of Background Art, PTL 1 discloses the configuration that destroys the thin portion provided at the end portion of the heat pipe at a time of overheating. It is difficult to apply the method to an electronic component vapor chamber having a flat shape. A first reason is that, since the electronic component vapor chamber having the flat shape includes an end portion having a thin thickness, it is difficult to provide the thin portion at the end portion. A second reason is that, since the electronic component vapor chamber is extremely smaller than the heat pipe disclosed in PTL 1, it is difficult to make a part of an outer member of the electronic component vapor chamber thin. Even when a part of the outer member can be made thin, a cost for the thinning increases, which is not practical.

An object of the present invention is to provide a protective structure and the like that can reduce an adverse effect due to splashing of a thermal medium caused by a burst of a vapor chamber.

Solution to Problem

A protective structure according to the present invention includes a perforation member including an end portion that, before a vapor chamber having a flat shape that includes an upper surface and a lower surface and contacts with an electronic component is overheated due to application of heat by the electronic component, either contacts with a first surface, which is either the upper surface or the lower surface, or is located near the first surface, and breaks an outer member of the vapor chamber and penetrates into an inside when the vapor chamber is overheated due to the application of heat.

Advantageous Effects of Invention

The protective structure and the like according to the present invention are able to reduce an adverse effect due to splashing of a thermal medium caused by a burst of the vapor chamber.

EXAMPLE EMBODIMENT

First Example Embodiment

A first example embodiment is an example embodiment regarding a protective structure that may form a hole in a vapor chamber before the vapor chamber bursts due to progression of overheating.

<Configuration and Operation>

Figure 2:
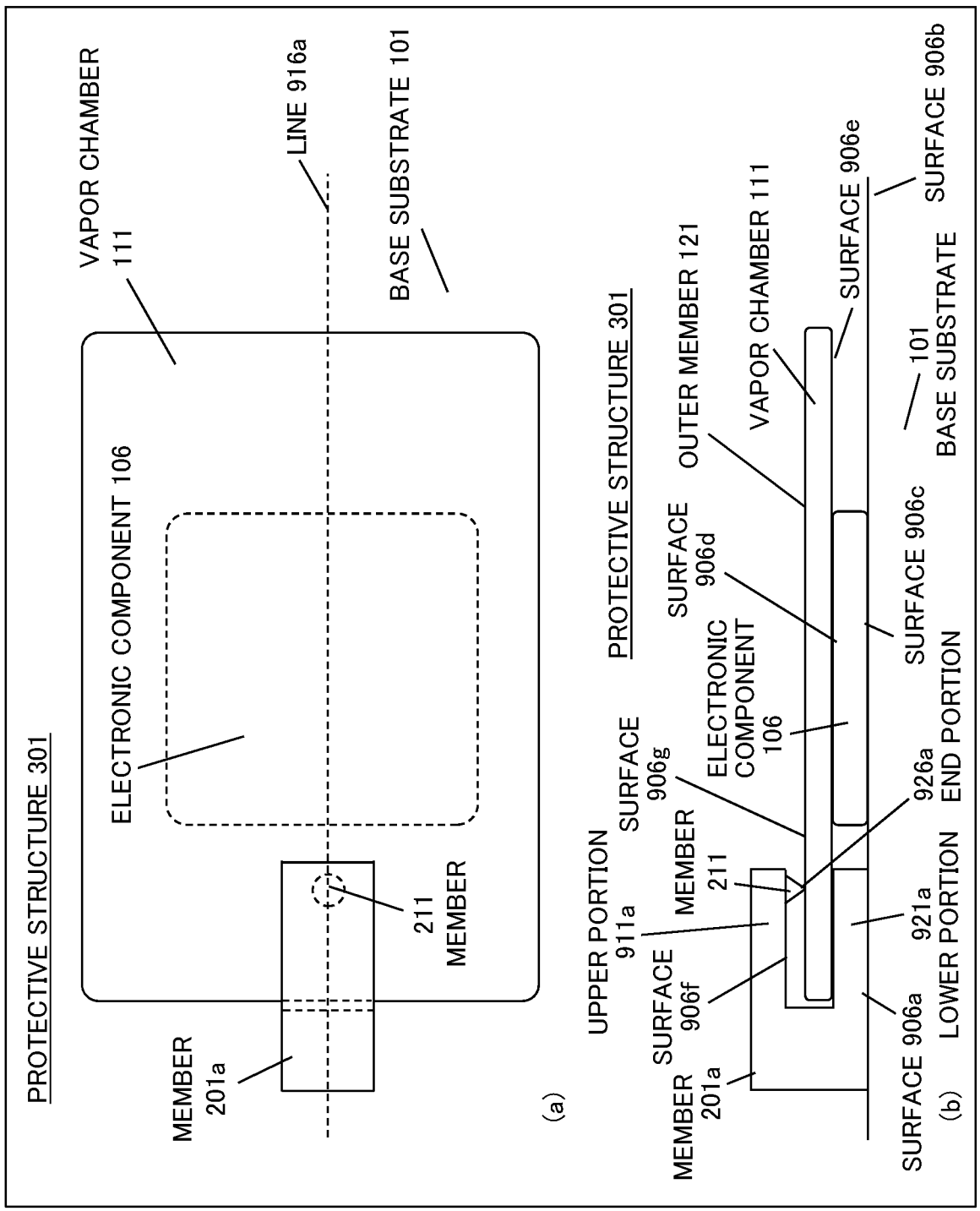
FIG. 2 is a schematic diagram illustrating a configuration example of a protective structure according to a first example embodiment.

FIG. 2 is a schematic diagram illustrating a configuration example of a protective structure 301 being an example of a protective structure according to the first example embodiment.

FIG. 2(a) illustrates a top view of the protective structure 301. Further, FIG. 2(b) illustrates a cross-sectional view on an assumption that the protective structure 301 is cut at a line 916a illustrated in FIG. 2(a).

The protective structure 301 includes a base substrate 101, an electronic component 106, a vapor chamber 111, and a member 201a. Each of the base substrate 101, the electronic component 106, and the vapor chamber 111 is the same as that illustrated in FIG. 1(a).

The electronic component 106 is, for example, an electronic component that generates heat, such as a central processing unit. In the electronic component 106, a surface 906c being a lower surface of the electronic component 106 is installed on a surface 906b being an upper surface of the base substrate 101.

The base substrate 101 is, for example, a substrate for installing an electronic component.

A surface 906d being an upper surface of the electronic component 106 is in contact with a surface 906e being a lower surface of the vapor chamber 111. By the contact, heat generated by the electronic component 106 is transmitted to the vapor chamber 111, and the heat is transmitted or radiated from the vapor chamber 111 to surroundings.

A surface 906a being a lower surface of the member 201a is fixed to the surface 906b of the base substrate 101. In the fixed state, an upper portion 911a of the member 201a extends above the vapor chamber 111.

A member 211 is fixed to a surface 906f of the upper portion 911a. An end portion 926a of the member 211 has a shape with a sharp tip as illustrated in FIG. 2, for example. The end portion 926a of the member 211 either contacts a surface 906g of the vapor chamber 111 or is located near the surface 906g. The end portion 926a may slightly dig into the surface 906g of the vapor chamber 111.

The end portion 926a of the member 211 is formed of a material harder than an outer member 121 of the vapor chamber 111. When the outer member 121 is copper, the material is, for example, a hard stainless material.

A lower portion 921a is a movement suppression member that suppresses a downward movement, near the member 211, of the surface 906e being the lower surface of the vapor chamber 111.

A not-illustrated heat radiation component may be installed on the surface 906g and the like of the vapor chamber 111. The heat radiation component is, for example, a fin for radiating heat to surroundings.

In FIG. 2(b), an upper surface of the lower portion 921a of the member 201a may be fixed to the surface 906e of the vapor chamber 111. In this case, the surface 906a of the member 201a may not be fixed to the surface 906b of the base substrate 101.

When the upper surface of the lower portion 921a of the member 201a is fixed to the surface 906e of the vapor chamber 111 and the surface 906a of the member 201a is not fixed to the surface 906b of the base substrate 101, there is a following advantage.

In other words, in the above-described case, a combination member that combines the vapor chamber 111 and the member 201a may be previously manufactured before the combination member is installed to the electronic component 106. Then, the protective structure 301 illustrated in FIG. 2 can be easily manufactured by installing the combination member in combination with the base substrate 101 and the electronic component 106. Further, in the above-described case, the above-described combination structure can also be distributed as a product.

Figure 3:
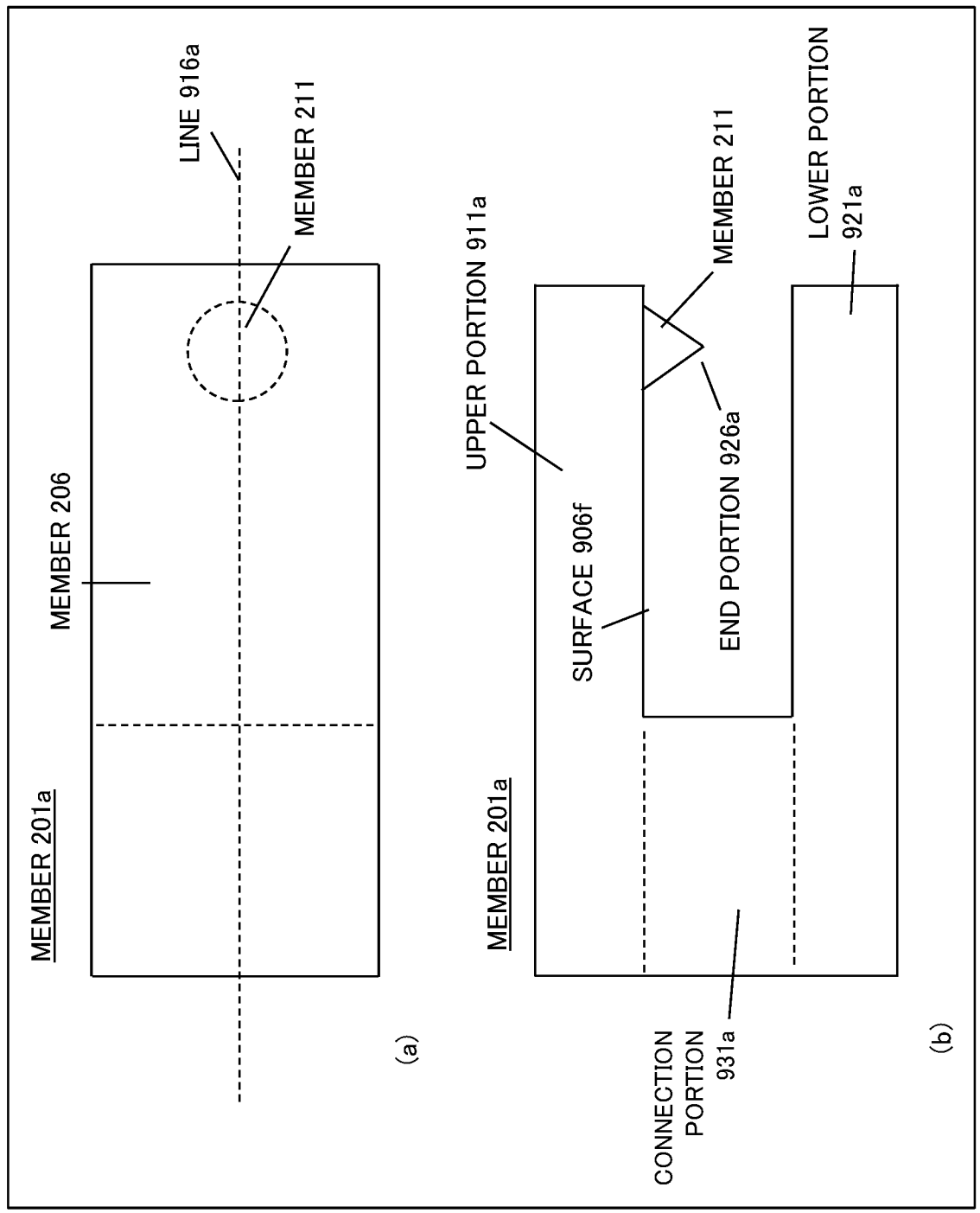
FIG. 3 is a schematic diagram illustrating a member 201a illustrated in FIG. 2.

FIG. 3 is a schematic diagram illustrating the member 201a illustrated in FIG. 2.

The member 201a includes the upper portion 911a, a connection portion 931a, the lower portion 921a, and the member 211.

The upper portion 911a, the connection portion 931a, and the lower portion 921a are fixed to each other. Two or more of the upper portion 911a, the connection portion 931a, and the lower portion 921a may be integrated. The end portion 926a of the member 211 has a sharp shape, for example.

When the vapor chamber 111 is overheated due to application of heat by the electronic component, the member 211 is a perforation member for perforating the surface 906g of the vapor chamber 111 illustrated in FIG. 2(b). A shape example near the end portion 926a of the member 211 will be described below with reference to FIGS. 5 to 8.

Note that an example of a round shape is illustrated in FIG. 3(a), but a shape of a connection portion between the member 211 and the surface 906f of a member 206 is not limited to a round shape and may be any shape.

Figure 4:
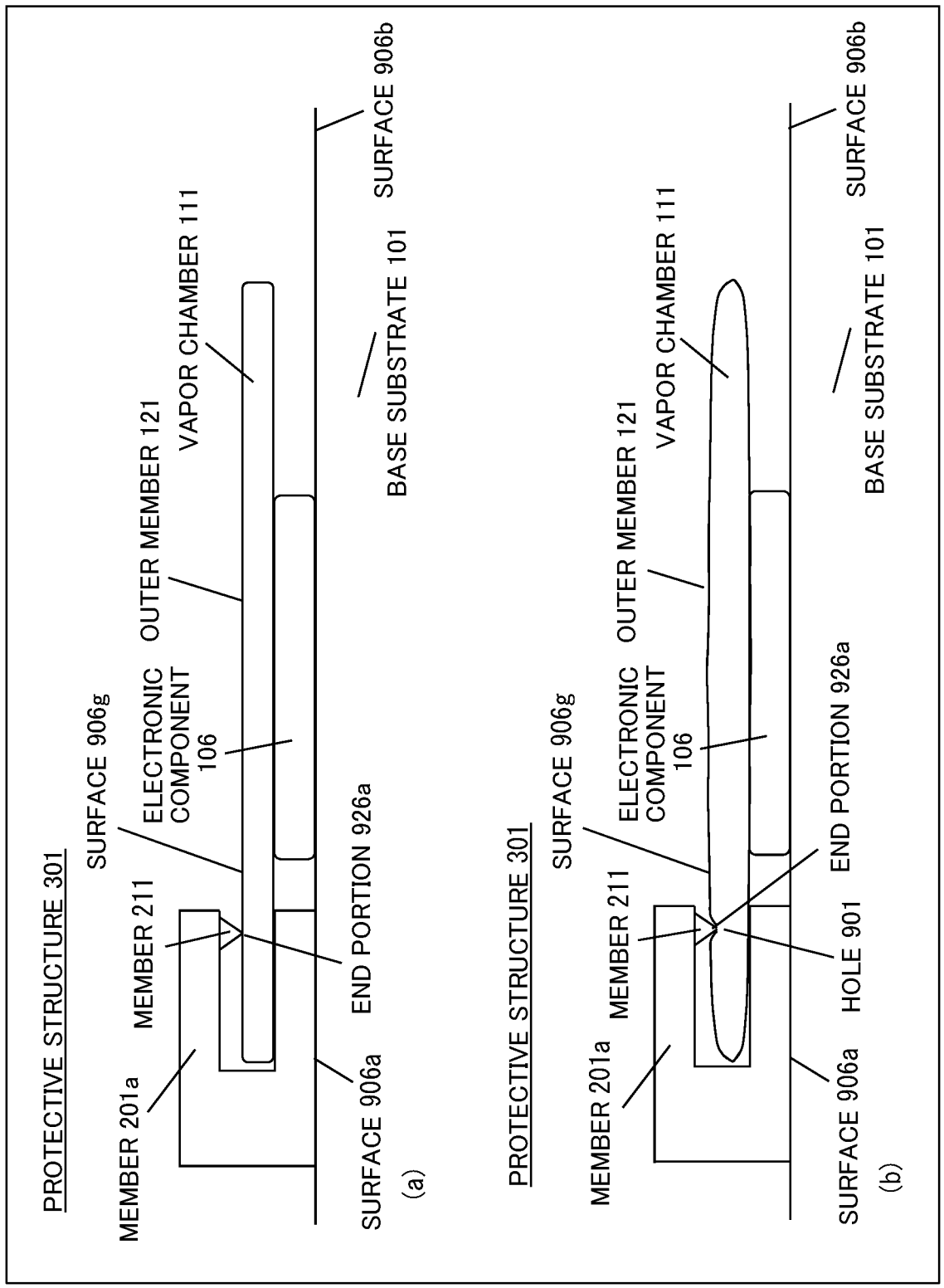
FIG. 4 is a schematic diagram illustrating a situation where perforation of the vapor chamber is performed in the protective structure.

FIG. 4 is a schematic diagram illustrating a situation where perforation of the vapor chamber 111 is performed in the protective structure 301 illustrated in FIG. 2.

FIG. 4(a) is a schematic diagram illustrating a state before the vapor chamber 111 is overheated due to application of heat generated by the electronic component 106.

In FIG. 4(a), the end portion 926a of the member 211 is either in contact with the surface 906g of the vapor chamber 111 or located near above the surface 906g.

The vapor chamber 111 illustrated in FIG. 4(b) is rounder than that illustrated in FIG. 4(a). This is because, in the outer member 121 of the vapor chamber 111, a force from an inside toward an outside of the outer member 121 is generated due to an expansion of a not-illustrated thermal medium encapsulated in the outer member 121.

A thickness of the vapor chamber 111 in the view of FIG. 4 is increased due to the deformation.

The end portion 926a of the member 211 digs in the outer member 121 due to the increase in the thickness, and a hole 901 is formed in the outer member 121.

Figure 1:
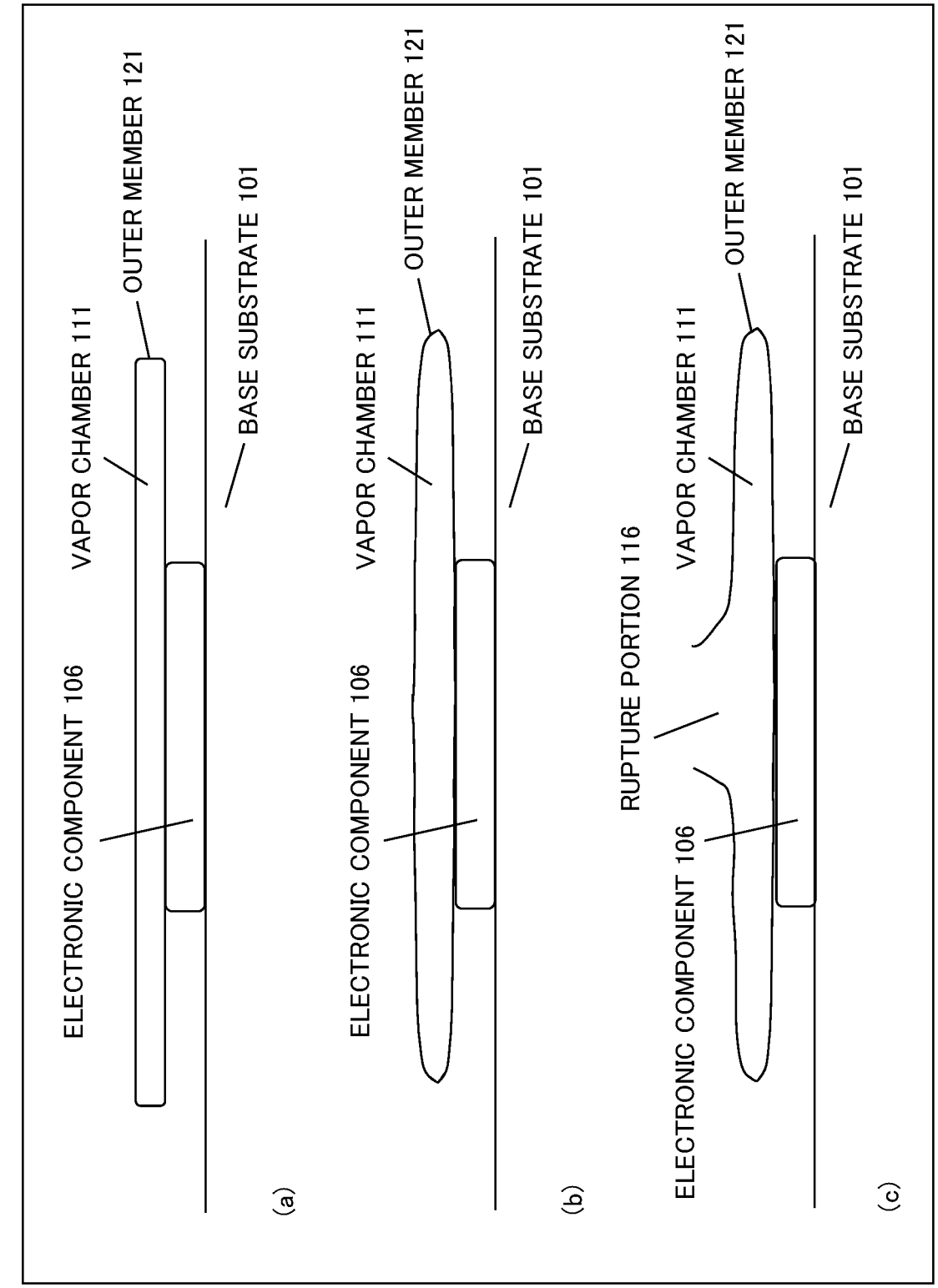
FIG. 1 is an image diagram illustrating a situation of a burst of a vapor chamber.

The thermal medium is radiated to the outside of the vapor chamber 111 through the hole 901. Formation of the hole 901 is performed at a stage at a lower temperature of the thermal medium than a temperature when application of heat to the vapor chamber 111 proceeds and the state illustrated in FIG. 1(c) is caused. An internal pressure of the vapor chamber 111 is relatively low at the temperature. Thus, a way in which the thermal medium is radiated is relieved as compared to a way in which the thermal medium is radiated in the state in FIG. 1(c).

Therefore, the protective structure 301 can relieve an adverse effect due to destruction of the vapor chamber 111 caused by overheating.

Figure 5:
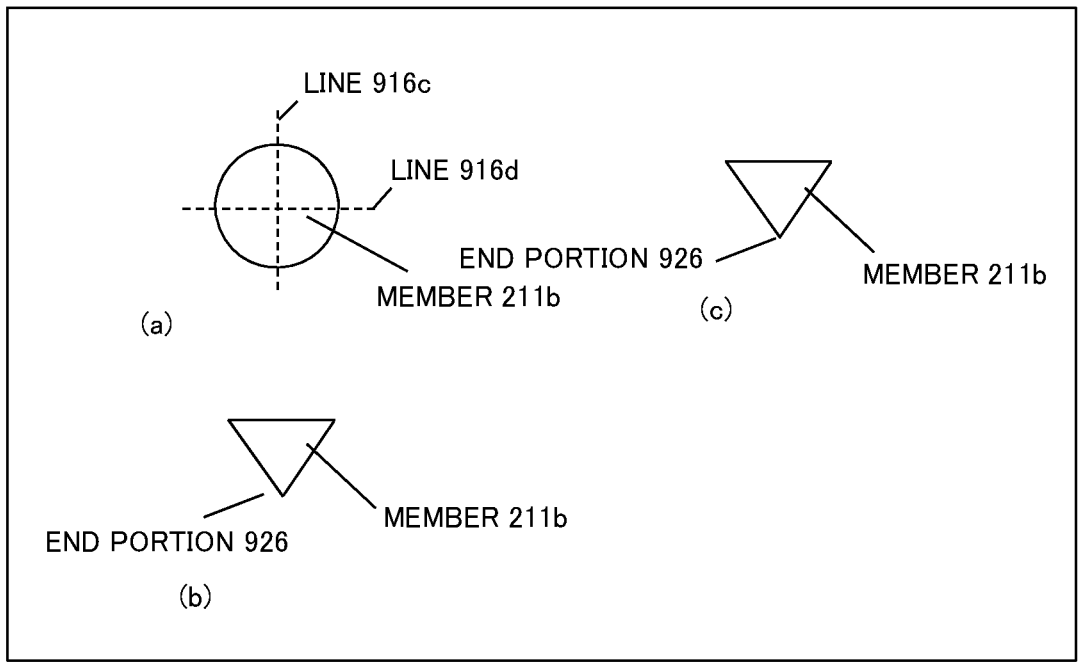
FIG. 5 is a schematic diagram illustrating a first example of a member 211.

FIG. 5 is a schematic diagram illustrating a member 211b being a first example of the member 211 illustrated in FIG. 3.

FIG. 5(a) is a diagram on an assumption that the end portion 926 of the member 211b is viewed from below in the view illustrated in FIG. 3(b). Further, FIG. 5(b) is a cross-sectional view on an assumption that the member 211b is cut at a line 916d illustrated in FIG. 5(a). Further, FIG. 5(c) is a cross-sectional view on an assumption that the member 211b is cut at a line 916c illustrated in FIG. 5(a).

The member 211b has a substantially conical shape.

Figure 6:
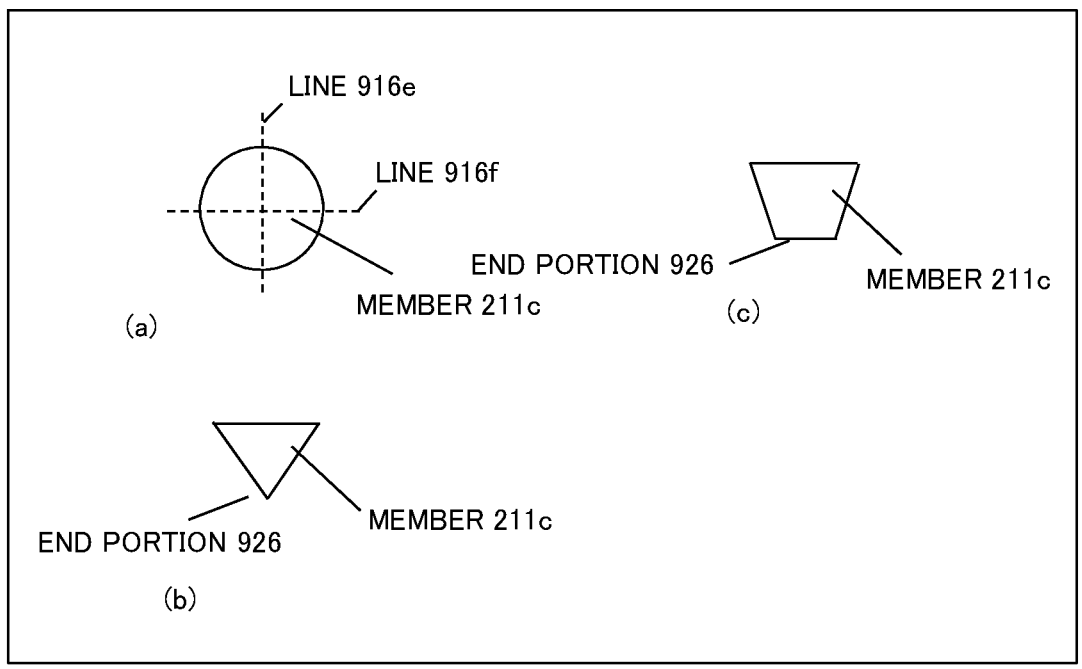
FIG. 6 is a schematic diagram illustrating a second example of the member 211.

FIG. 6 is a schematic diagram illustrating a member 211c being a second example of the member 211 illustrated in FIG. 3.

FIG. 6(a) is a diagram on an assumption that a direction of the end portion 926 of the member 211c is viewed from below in the view illustrated in FIG. 3(b). Further, FIG. 6(b) is a cross-sectional view on an assumption that the member 211c is cut at a line 916f illustrated in FIG. 6(a). Further, FIG. 6(c) is a cross-sectional view on an assumption that the member 211c is cut at a line 916e illustrated in FIG. 6(a).

The member 211c includes a blade near the end portion 926.

Figure 7:
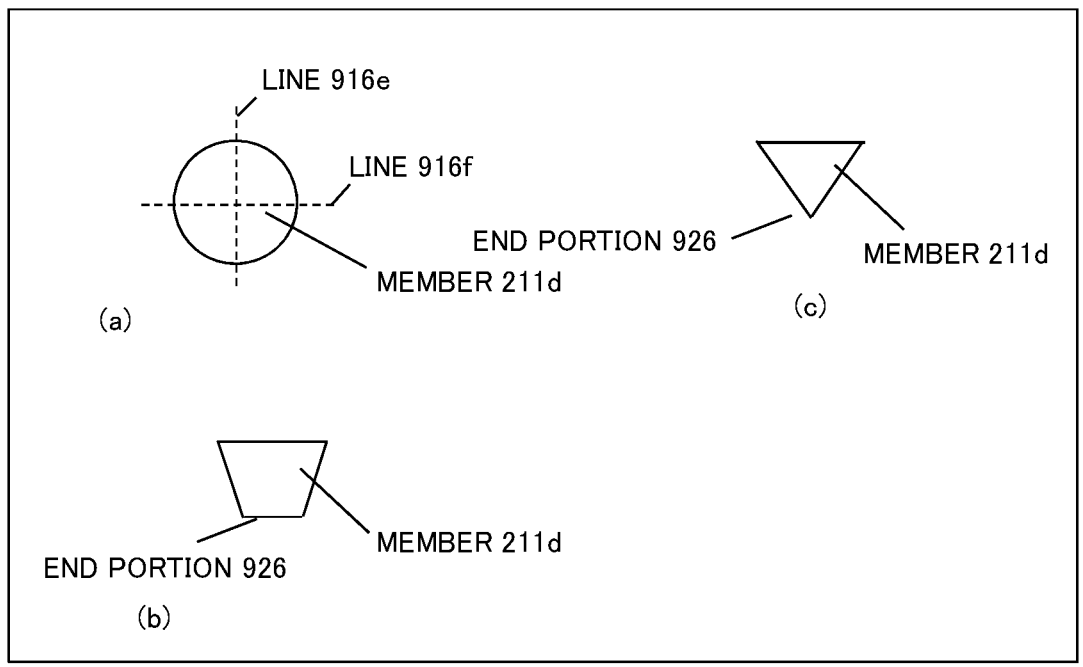
FIG. 7 is a schematic diagram illustrating a third example of the member 211.

FIG. 7 is a schematic diagram illustrating a member 211d being a third example of the member 211 illustrated in FIG. 3.

FIG. 7(a) is a diagram on an assumption that the end portion 926 of the member 211d is viewed from below in the view illustrated in FIG. 3(b). Further, FIG. 7(b) is a cross-sectional view on an assumption that the member 211d is cut at a line 916f illustrated in FIG. 7(a). Further, FIG. 6(c) is a cross-sectional view on an assumption that the member 211b is cut at a line 916e illustrated in FIG. 6(a).

A shape of the member 211d is the same as a shape of the member 211c illustrated in FIG. 6, and the member 211d is rotated 90 degrees in the view illustrated in FIG. 3(a) and installed on the surface 906f illustrated in FIG. 3(b).

Figure 8:
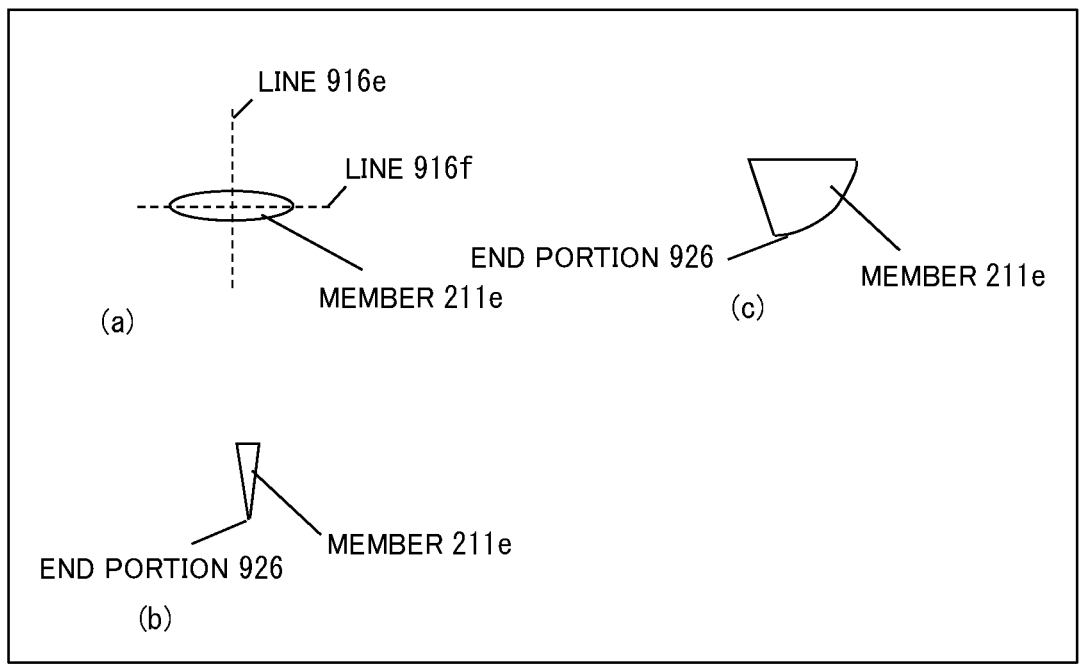
FIG. 8 is a schematic diagram illustrating a fourth example of the member 211.

FIG. 8 is a schematic diagram illustrating a member 211e being a fourth example of the member 211 illustrated in FIG. 3.

FIG. 8(a) is a diagram on an assumption that the end portion 926 of the member 211e is viewed from below in the view illustrated in FIG. 3(b). Further, FIG. 8(b) is a cross-sectional view on an assumption that the member 211e is cut at a line 916e illustrated in FIG. 8(a). Further, FIG. 8(c) is a cross-sectional view on an assumption that the member 211e is cut at a line 916f illustrated in FIG. 8(a).

A shape near the end portion 926 of the member 211e is a shape similar to a tip end portion of a blade of a knife.

Figure 9:
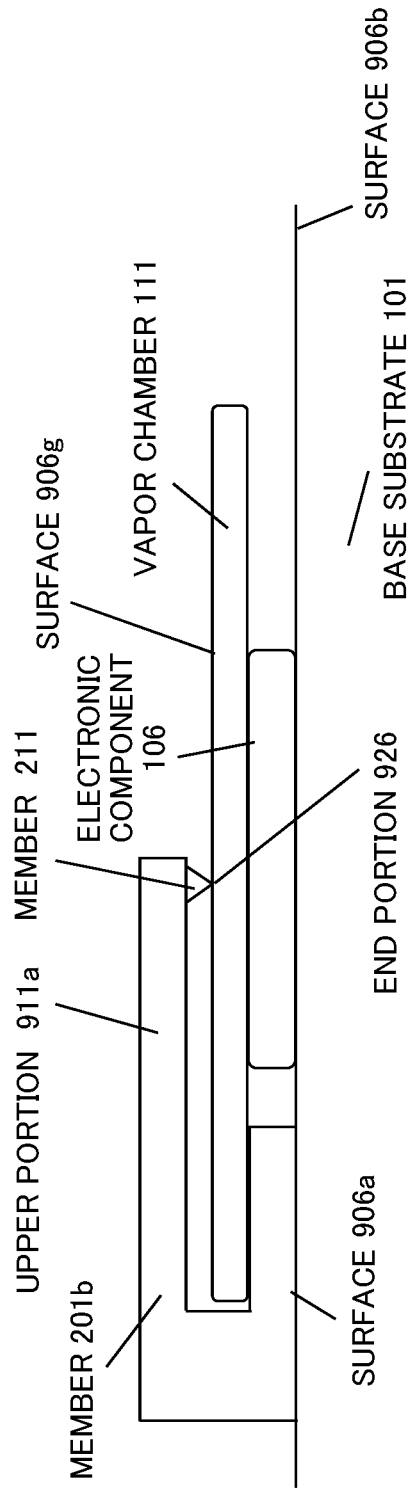
FIG. 9 is a schematic diagram illustrating a first variation of the protective structure.

FIG. 9 is a schematic diagram illustrating a protective structure 301b to which a member 201b being a first variation of the member 201a illustrated in FIG. 2 is applied.

In the protective structure 301b, an upper portion 911a of the member 201b extends above a central portion of the vapor chamber 111. Then, an end portion of a member 211 contacts a surface 906g or is located near the surface 906g, near the central portion.

A thickness when the vapor chamber 111 is overheated due to application of heat by an electronic component 106 is the thickest near the central portion of the vapor chamber 111. Thus, the protective structure 301b enables perforation of the vapor chamber 111 by an end portion 926 at an early stage of overheating.

Figure 10:
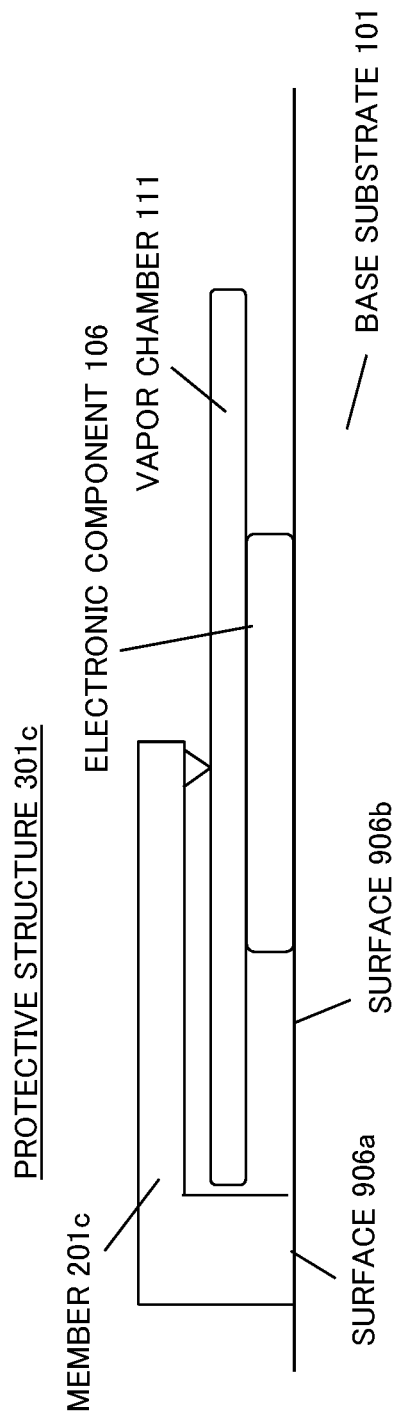
FIG. 10 is a schematic diagram illustrating a second variation of the protective structure.

FIG. 10 is a schematic diagram illustrating a protective structure 301c to which a member 201c being a second variation of the member 201a illustrated in FIG. 2 is applied.

A surface 906a being a lower surface of the member 201c of the protective structure 301c has an area that contacts a surface 906b being an upper surface of a base substrate 101 smaller than that of a surface 906a being a lower surface of the member 201b illustrated in FIG. 9. Also, in the case illustrated in FIG. 10, the member 201c may be fixed to the surface 906b.

Figure 11:
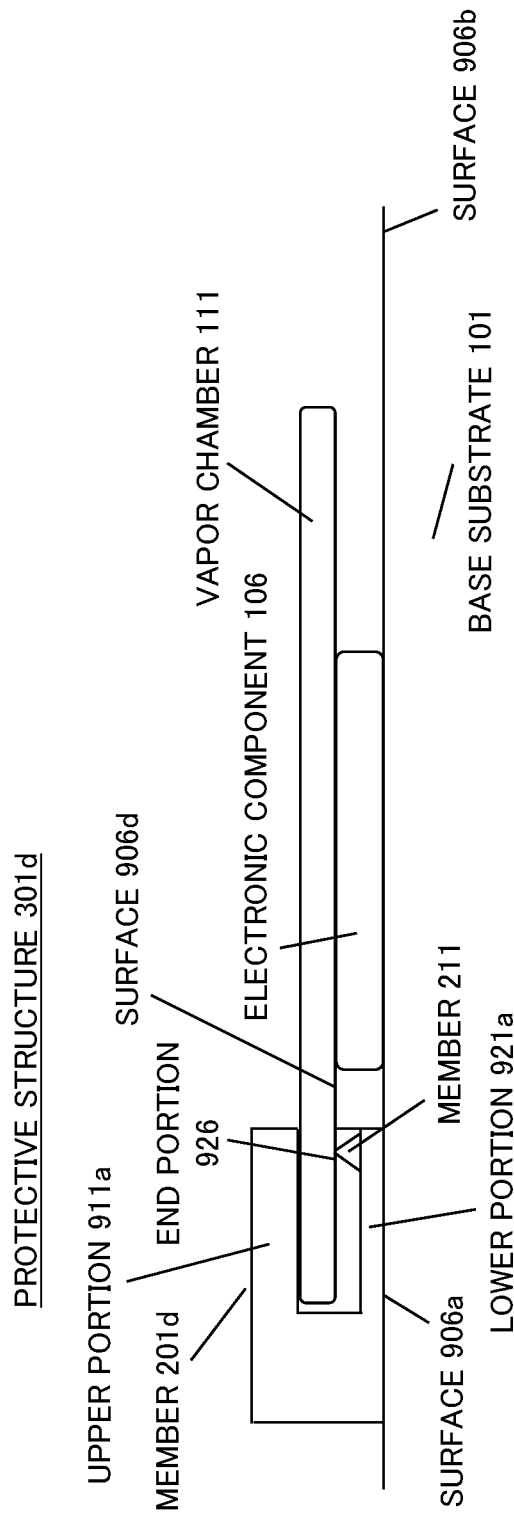
FIG. 11 is a schematic diagram illustrating a third variation of the protective structure.

FIG. 11 is a schematic diagram illustrating a protective structure 301d to which a member 201d being a third variation of the member 201a illustrated in FIG. 2 is applied.

A lower portion 921a of the member 201d is not in contact with a vapor chamber 111. An end portion 926 of a member 211 installed on the lower portion 921a contacts a surface 906d of the vapor chamber 111 or is located near the surface 906d. A portion of an upper surface of the vapor chamber 111 above the end portion 926 is pressed by a lower surface of an upper portion 911a.

Thus, when a thickness of the vapor chamber 111 increases due to overheating, the end portion 926 is stuck into an outer member of the vapor chamber 111, and a hole is formed in the outer member.

In FIG. 11, the lower surface of the upper portion 911a of the member 201d may be fixed to the upper surface of the vapor chamber 111. In this case, a surface 906a of the lower portion 921a of the member 201d may not be fixed to a surface 906b of a base substrate 101.

When the lower surface of the upper portion 911a of the member 201d is fixed to the upper surface of the vapor chamber 111 and the surface 906a of the lower portion 921a of the member 201d is not fixed to the surface 906b of the base substrate 101, there is a following advantage.

In other words, in the above-described case, a combination member that combines the vapor chamber 111 and the member 201d may be previously manufactured before the combination member is installed to the electronic component 106. Then, the protective structure 301d illustrated in FIG. 11 can be easily manufactured by installing the combination member in combination with the base substrate 101 and the electronic component 106. Further, in the above-described case, the above-described combination structure can also be distributed as a product.

Figure 12:
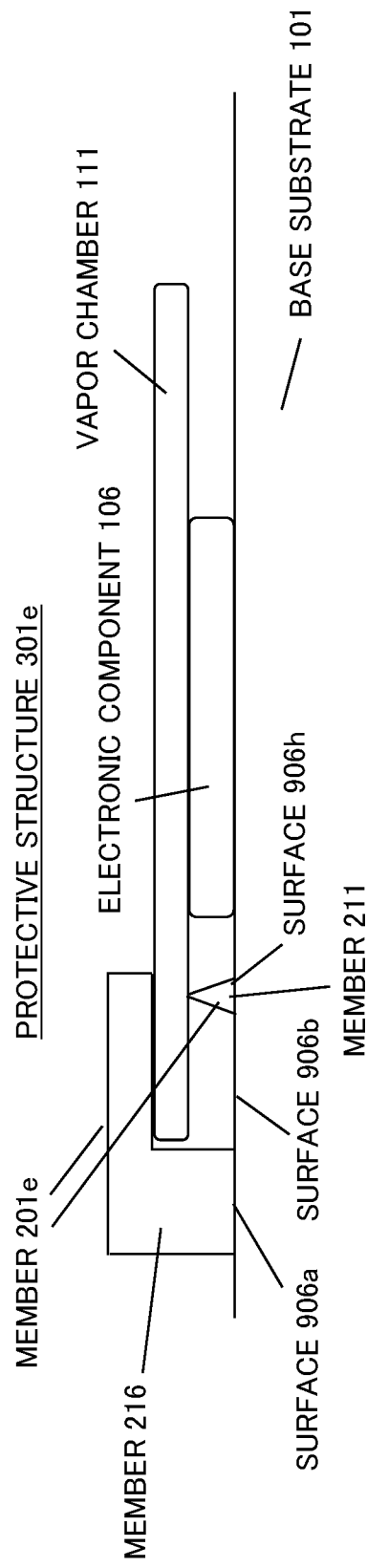
FIG. 12 is a schematic diagram illustrating a fourth variation of the protective structure.

FIG. 12 is a schematic diagram illustrating a protective structure 301e to which a member 201e being a fourth variation of the member 201a illustrated in FIG. 2 is applied.

The member 201e includes a member 216 and a member 211 that are members separated from each other.

A surface 906a being a lower surface of the member 216 is fixed to a surface 906b being an upper surface of a base substrate 101. A surface 906h being a lower surface of the member 211 is fixed to the surface 906b being the upper surface of the base substrate 101.

Figure 13:
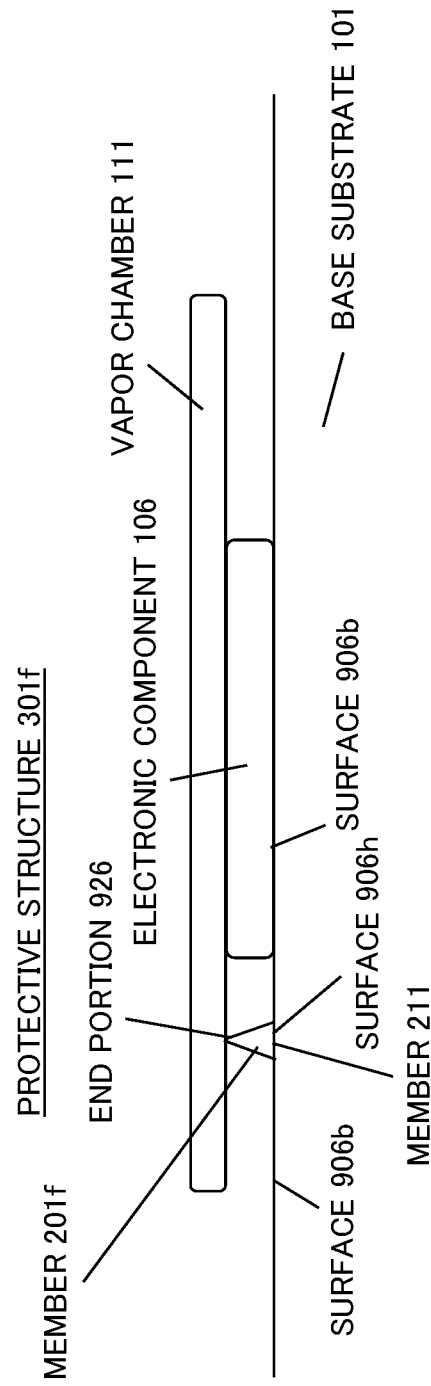
FIG. 13 is a schematic diagram illustrating a fifth variation of the protective structure.

FIG. 13 is a schematic diagram illustrating a protective structure 301f to which a member 201f being a fifth variation of the member 201a illustrated in FIG. 2 is applied.

In the protective structure 301f, the member 201f is formed of only a member 211.

A surface 906h being a lower surface of the member 211 is fixed to a surface 906b being an upper surface of a base substrate 101.

Even in a configuration of the protective structure 301f, an end portion 926 of the member 211, when a vapor chamber 111 is overheated, can perforate a lower surface of the vapor chamber 111 under a predetermined condition. The condition is, for example, a case where a not-illustrated object is installed on the vapor chamber 111. It is assumed that an upward movement of an upper surface of the vapor chamber 111 is restricted by the object pressing the upper surface. In this case, the end portion 926 can form a hole in the lower surface of the vapor chamber 111 having a thickness increased by overheating.

The not-illustrated above-described object installed on the vapor chamber 111 is a heat radiation component such as a heat radiation fin, for example.

Advantageous Effect

In a protective structure according to the first example embodiment, when a vapor chamber is overheated due to application of heat by an electronic component, a perforation member forms a hole in the vapor chamber before the vapor chamber bursts. A thermal medium in the vapor chamber flows out to an outside through the hole, and a burst of the vapor chamber is prevented. Formation of the hole is performed at a temperature lower than a temperature at which the burst occurs. Thus, an outflow of the thermal medium to the outside of the vapor chamber is calmer than splashing of the thermal medium caused by the burst.

Thus, the protective structure can reduce an adverse effect due to splashing of the thermal medium caused by a burst of the vapor chamber.

Second Example Embodiment

A second example embodiment is an example embodiment regarding a protective structure that can further relieve an adverse effect due to an outflow of a thermal medium from a hole formed by a perforation member.

<Configuration and Operation>

Figure 14:
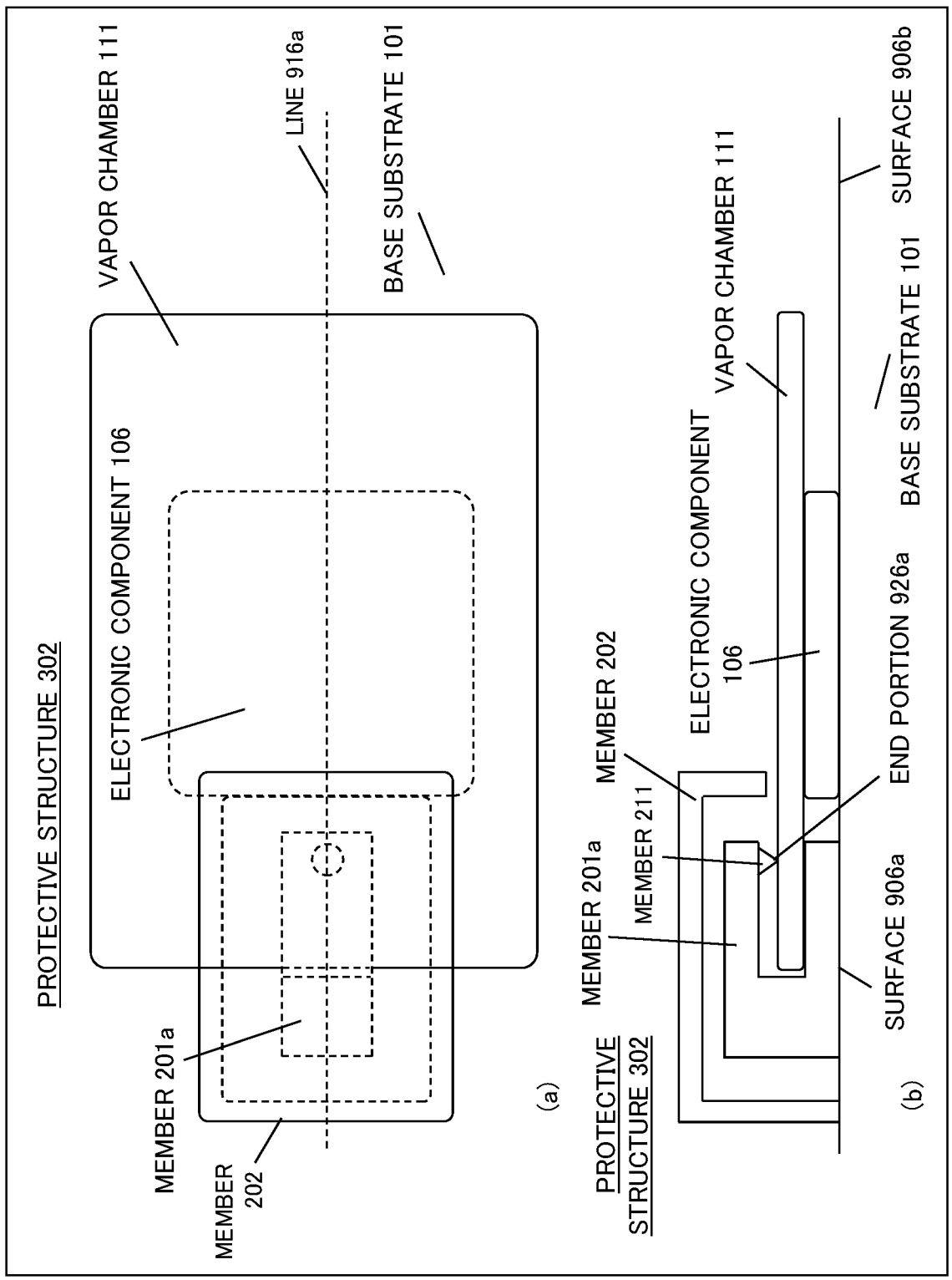
FIG. 14 is a schematic diagram illustrating a configuration example of a protective structure according to a second example embodiment.

FIG. 14 is a schematic diagram illustrating a protective structure 302 being an example of the protective structure according to the second example embodiment.

FIG. 14(a) is a top view of the protective structure 302. FIG. 14(b) is a cross-sectional view on an assumption that the protective structure 302 is cut at a line 916a illustrated in FIG. 14(a).

The protective structure 302 is acquired by adding a member 202 to the protective structure 301 illustrated in FIG. 2. The member 202 is formed on a surface 906b of a base substrate 101. The member 202 is installed in such a way as to cover a member 201a. The member 202 is also installed in such a way as to cover the vicinity of an end portion 926a of a member 211. Thus, even when the end portion 926a forms a hole in a vapor chamber 111 having a thickness increased by overheating and a thermal medium splashes from the hole due to an outflow, splashing of the thermal medium to an outside of a portion covered with the member 201 is suppressed.

Advantageous Effect

The protective structure according to the second example embodiment includes the same configuration as that of the protective structure according to the first example embodiment, and achieves an effect similar to that of the protective structure according to the first example embodiment.

In addition, the protective structure according to the second example embodiment can suppress splashing of a thermal medium flowing out from a hole formed in the vapor chamber 111 having a thickness increased by overheating.

Figure 15:
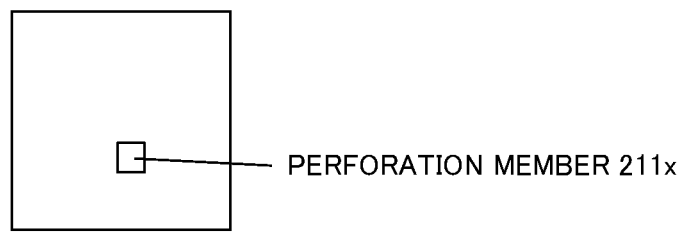
FIG. 15 is a block diagram illustrating a minimum configuration of a protective structure according to an example embodiment.

FIG. 15 is a schematic diagram illustrating a protective structure 301x being a minimum configuration of the protective structure according to an example embodiment.

The protective structure 301x includes a perforation member 211x.

An end portion of the perforation member 211x either contacts a first surface or is located near the first surface before a vapor chamber having a flat shape that includes an upper surface and a lower surface and contacts an electronic component is overheated due to application of heat by the electronic component. Herein, the first surface is either the upper surface or the lower surface.

When the vapor chamber is overheated due to the application of heat, the end portion breaks an outer member of the vapor chamber and penetrates into an inside.

In the protective structure 301x, when the vapor chamber is overheated due to application of heat by the electronic component, the perforation member perforates the vapor chamber before the vapor chamber bursts. A thermal medium in the vapor chamber flows out to an outside through the hole, and a burst of the vapor chamber is prevented. Formation of the hole is performed at a temperature lower than a temperature at which the burst occurs. Thus, an outflow of the thermal medium to the outside of the vapor chamber is calmer than splashing of the thermal medium caused by the burst.

Thus, the protective structure 301x can reduce an adverse effect due to splashing of the thermal medium caused by a burst of the vapor chamber.

Thus, the protective structure 301x with the above-described configuration achieves the effect described in the section of "Advantageous Effects of Invention".

While the invention has been particularly shown and described with reference to example embodiments thereof, the invention is not limited to these embodiments. For example, the constitution of elements shown in each figure are only example to help ones to understand the present invention, and do not limit the scope of the present invention.

The whole or part of the example embodiments disclosed above can be described as, but not limited to, the following supplementary notes.

(Supplementary Note 1)

A protective structure, including a perforation member including an end portion that, before a vapor chamber having a flat shape that includes an upper surface and a lower surface and contacts with an electronic component is overheated due to application of heat by the electronic component, either contacts with a first surface, which is either the upper surface or the lower surface, or is located near the first surface, and is located in such a way as to break an outer member of the vapor chamber and penetrate into an inside when the vapor chamber is overheated.

(Supplementary Note 2)

The protective structure according to supplementary note 1, wherein the vapor chamber includes a configuration that seals a thermal medium by an outer member, and the end portion is formed of a member harder than the outer member.

(Supplementary Note 3)

The protective structure according to supplementary note 2, wherein a material of the outer member is copper or aluminum.

(Supplementary Note 4)

The protective structure according to supplementary note 3, wherein a thickness of the outer member is equal to or less than 1 mm.

(Supplementary Note 5)

The protective structure according to supplementary note 3, wherein a thickness of the outer member is 0.4 to 0.7 mm.

(Supplementary Note 6)

The protective structure according to supplementary note 2, wherein the end portion is formed of a stainless material.

(Supplementary Note 7)

The protective structure according to any one of supplementary notes 1 to 6, wherein the end portion penetrates into the inside by a movement of the first surface in a direction perpendicular to the first surface due to the overheating.

(Supplementary Note 8)

The protective structure according to any one of supplementary notes 1 to 6, wherein the end portion is sharp toward the first surface.

(Supplementary Note 9)

The protective structure according to any one of supplementary notes 1 to 6, wherein the end portion includes a blade facing the first surface.

(Supplementary Note 10)

The protective structure according to any one of supplementary notes 1 to 9, wherein a second surface that is not the first surface among the upper surface and the lower surface is in contact with the electronic component.

(Supplementary Note 11)

The protective structure according to supplementary note 10, further including a first movement suppression member that suppresses a movement of the first surface in a direction perpendicular to the first surface due to the overheating.

(Supplementary Note 12)

The protective structure according to any one of supplementary notes 1 to 11, wherein the first surface is in contact with the electronic component.

(Supplementary Note 13)

The protective structure according to supplementary note 12, further including a second movement suppression member that suppresses a movement of a second surface that is not the first surface among the upper surface and the lower surface in a direction perpendicular to the second surface due to the overheating.

(Supplementary Note 14)

The protective structure according to any one of supplementary notes 1 to 13, further including a wall being provided on at least a part of surroundings of the perforation member.

(Supplementary Note 15)

The protective structure according to supplementary note 14, wherein the wall is formed in such a way as to cover the surroundings.

(Supplementary Note 16)

The protective structure according to any one of supplementary notes 1 to 15, further including the electronic component.

(Supplementary Note 17)

The protective structure according to any one of supplementary notes 1 to 16, further including the vapor chamber.

(Supplementary Note 18)

The protective structure according to supplementary note 17, wherein the perforation member is fixed to the vapor chamber.

(Supplementary Note 19)

The protective structure according to supplementary note 18, wherein the fixing is performed via another member.

(Supplementary Note 20)

A perforation member, including an end portion that, before a vapor chamber having a flat shape that contacts with an electronic component is overheated due to application of heat by the electronic component, either contacts with a first surface, which is either an upper surface of the vapor chamber or a lower surface of the vapor chamber, or is located near the first surface, and breaks an outer member of the vapor chamber and penetrates into an inside when the vapor chamber is overheated due to the application of heat.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-025041, filed on Feb. 15, 2018, the disclosure of which is incorporated herein in its entirety by reference.

REFERENCE SIGNS LIST

101 Base substrate
106 Electronic component
111 Vapor chamber
116 Rupture portion
121 Outer member
201a, 201b, 201c, 201d, 201e, 201f, 211, 211b, 211c, 211d, 211e, 202 Member
301, 301b, 301c, 301d Protective structure
901 Hole
906a, 906b, 906c, 906d, 906e, 906f, 906g Surface
911a Upper portion
916a, 916c, 916d, 916e, 916f Line
921a Lower portion
926 End portion
931a Connection portion

The invention claimed is:

1. A protective structure, comprising
a perforation member including an end portion that, before a vapor chamber is overheated due to application of heat by an electronic component, is located in such a way as to break an outer member of the vapor chamber and the end portion penetrates into an inside of the vapor chamber when the vapor chamber is overheated,
wherein the vapor chamber has a flat shape that includes an upper surface and a lower surface, and the lower surface contacts the electronic component, and
wherein the protective structure further comprises a protective member with a recess that a portion of a first surface of the vapor chamber, which is one of the upper surface and the lower surface, enters and contacts to prevent movement of the vapor chamber in a direction perpendicular to the first surface due to overheating, wherein the perforation member is provided on the protective member and faces a second surface of the vapor chamber other than the first surface of the vapor chamber.

2. The protective structure according to claim 1, wherein the vapor chamber includes a configuration that seals a thermal medium by the outer member, and
the end portion is formed of a member harder than the outer member.

3. The protective structure according to claim 2, wherein a material of the outer member is copper or aluminum.

4. The protective structure according to claim 3, wherein a thickness of the outer member is equal to or less than 1 mm.

5. The protective structure according to claim 3, wherein a thickness of the outer member is 0.4 to 0.7 mm.

6. The protective structure according to claim 2, wherein the end portion is formed of a stainless material.

7. The protective structure according to claim 1, wherein the end portion penetrates into the inside by a movement of the first surface in a direction perpendicular to the first surface due to the overheating.

8. The protective structure according to claim 1, wherein the end portion is sharp toward the first surface.

9. The protective structure according to claim 1, wherein the end portion includes a blade facing the first surface.

10. The protective structure according to claim 1, wherein the second surface is in contact with the electronic component.

11. The protective structure according to claim 1, wherein the first surface is in contact with the electronic component.

12. The protective structure according to claim 1, further comprising
a wall being provided on at least a part of surroundings of the perforation member.

13. The protective structure according to claim 12, wherein
the wall is formed in such a way as to cover the surroundings.

14. The protective structure according to claim 1, wherein the perforation member is fixed to the vapor chamber.

15. The protective structure according to claim 14, wherein
the fixing is performed via another member.

16. A perforation member comprising an end that, before a vapor chamber overheats due to heating by an electronic component, is in contact with or near the vapor chamber which has flat shape and is in contact with the electronic device,
wherein the electronic component contacts a first surface which is one of an upper surface of the vapor chamber or a lower surface of the vapor chamber,
wherein the end portion breaks an outer member of the vapor chamber and penetrates into an inside when the vapor chamber is overheated due to application of heat, and
wherein a portion of the first surface of the vapor chamber enters and contacts a recess of a protective member to prevent movement of the vapor chamber in a direction perpendicular to the first surface due to overheating, wherein the perforation member is provided on the protective member and faces a second surface of the vapor chamber other than the first surface of the vapor chamber.

* * * * *